United States Patent [19]
Herbst

[11] Patent Number: 6,027,328
[45] Date of Patent: Feb. 22, 2000

[54] APPARATUS FOR INJECTION-MOLDING PLASTIC MATERIAL ITEMS

[76] Inventor: Richard Herbst, Freisinger Strasse 3b, D-85386, Eching, Germany

[21] Appl. No.: 08/806,792

[22] Filed: Feb. 26, 1997

[30] Foreign Application Priority Data

| Feb. 26, 1996 | [DE] | Germany | 196 07 213 |
| Apr. 12, 1996 | [DE] | Germany | 196 14 532 |
| May 3, 1996 | [DE] | Germany | 196 17 768 |

[51] Int. Cl.[7] ................................. B29C 45/38
[52] U.S. Cl. ............... 425/553; 264/328.9; 264/161; 425/566; 425/572; 425/577
[58] Field of Search ............ 264/328.9, 328.7, 264/328.11, 161, 155, 154, 163, 328.8; 425/553, 555, 562, 566, 571, 572, 577, 588

[56] References Cited

U.S. PATENT DOCUMENTS

| 2,698,460 | 1/1955 | Amo | 264/328.9 |
| 2,698,464 | 1/1955 | Wilson | 264/328.9 |
| 3,712,777 | 1/1973 | Sherer | 264/328.9 |
| 3,937,779 | 2/1976 | Simmons | 264/154 |
| 3,996,330 | 12/1976 | Jones et al. | 264/328.9 |
| 4,404,160 | 9/1983 | Bonissone et al. | 264/328.9 |
| 4,466,934 | 8/1984 | Cane et al. | 264/328.9 |
| 5,068,065 | 11/1991 | Maus et al. | 264/328.7 |
| 5,458,821 | 10/1995 | Shimazu et al. | 264/328.7 |
| 5,460,508 | 10/1995 | Ohno et al. | 264/328.9 |
| 5,472,334 | 12/1995 | Takahashi | 264/328.7 |
| 5,512,223 | 4/1996 | Moridita | 264/328.7 |
| 5,545,365 | 8/1996 | Asai | 264/328.7 |
| 5,551,858 | 9/1996 | Yoshizawa et al. | 264/161 |
| 5,725,819 | 3/1998 | Onishi et al. | 264/328.7 |

*Primary Examiner*—Jill L. Heitbrink
*Attorney, Agent, or Firm*—Knobbe, Martens, Olson & Bear, LLP

[57] ABSTRACT

A method for injection molding plastic material items and an appropriate mold are disclosed. The mold comprises at least one cavity and a gate channel for feeding molten plastic material to the cavity. The gate channel is connected to the cavity through an opening. The molten plastic material is injected into the gate channel and through the opening into the cavity. A piston may be displaced along the gate channel and over the opening for interrupting flow of molten plastic material into the cavity and for shearing off the molten plastic material along the opening, thereby closing the cavity.

4 Claims, 8 Drawing Sheets

APPARATUS FOR INJECTION-MOLDING PLASTIC MATERIAL ITEMS

FIELD OF THE INVENTION

The invention relates to a method for injection-molding plastic material items and, further, relates to a mold for injection molding such items.

More specifically, the invention relates to such a method using a mold comprising at least one cavity and a gate channel for feeding molten plastic material to the cavity, wherein the gate channel is connected to the cavity through an access opening.

BACKGROUND OF THE INVENTION

When plastic material items are to be injection-molded in a mold of the afore-mentioned kind, the problem arises to manufacture such items with a sprue being almost invisible. For, if the cavity is filled with molten plastic material through the gate channel and via the cavity access opening and the plastic material subsequently solidifies within the cavity, the portion of plastic material extending through the access opening must be severed off during the ejection of the plastic material item. The severing off may be effected by tearing off, cutting off or the like.

Due to this kind of sprue the plastic material item has an irregularity on its surface being otherwise regular. The customers ordering such plastic material items, however, strongly dislike this kind of irregularities. This is particularly true in cases where the sprue is located in the area of a visible edge, in particular if the plastic material item is to be used for advertising or other sales promotional purposes. One example of such application are so-called smart cards.

The present invention is preferably, but not exclusively, directed to the field of smart cards. The term smart card is used to describe a plastic card with one or two laminated sides, which usually carry some instructions and/or advertising printed thereon and/or certain safety features, for example a hologram, a magnetic strip, a photo of the card holder, or the like. A sort of module is embedded in the smart card. The module consists of an integrated semiconductor electronic circuit (chip) and, usually, of a contact-and-carrier plate carrying the chip. In the case of smart cards, the wafer coacts with a plurality of surface segments to form electric contacts that are accessible from the outside. In the case of other cards, antennas are provided in the card for the non-contact exchange of information, for example of data. Smart cards of that kind are employed as telephone cards, authentication cards for mobile communication equipment, as credit cards for money transactions, as authorization cards for medical insurance organizations or the like.

Smart cards are normally produced by injection molding. For that purpose a mold is used that normally consists of two or more portions, the so-called mold portions. A cavity being provided in the mold has the shape of a flat parallelepiped, i.e. the shape of the smart card. Conventionally, the plastic material is plastified and liquified in a plastic material injection assembly and the molten liquid plastic material is then injected into the cavity via its opening. For the production of smart cards the opening is conventionally configured as a gate slot being located in the area of a narrow edge of the cavity. This configuration is normally referred to a as film sprue.

European patent document 0 399 868 discloses a method for producing a smart card. In this prior art method the slot on the narrow edge of a cavity continues into an auxiliary cavity located adjacent the cavity. A frusto-conical feed channel opens into the auxiliary cavity and has an axis extending vertically with respect to the flat cavity surface. The molten plastic material flows through the feed channel into the auxiliary cavity, is then deflected by 90° and then flows into the cavity through the sprue slot.

In the manufacture of smart cards it is, further, customary to connect the feed channel directly to a flat cavity surface. If no further measures are taken, the problem arises that after the molten plastic material is entirely filled into the cavity, a sprue remains which is disturbing after the smart card was ejected. Even when the sprue is removed after the ejection of the smart card, for example by breaking or cutting it off, an irregularity remains on the surface which is not acceptable to the customers of smart cards.

One has, therefore, attempted to solve this problem by inserting a needle valve into a feed channel opening into a flat cavity surface. The needle valve has a feed sleeve and a needle therein that can be displaced along the sleeve axis. During injection the needle is located in a retracted position. The liquified plastic material will then flow in an axial direction along the needle and will then flow around the needle tip and through the opening into the cavity. As soon as the filling step and, if desired, a compacting step is completed, the needle will be displaced from its retracted position into a forward position in which its flattened tip will close the opening connecting the needle valve to the cavity. Although it is theoretically possible to thusly close the inner cavity surface almost homogeneously, when the flattened needle tip snugly fits into the cavity opening, this is in practice impossible to achieve because the needle valve sleeve as well as the needle itself are subject to wear and are, hence, worn off even after a relatively short operational time. If the needle and/or the sleeve are worn off, this again gives rise to irregularities within the surface of the smart cards.

The present invention is by no means limited to the field of application of smart cards. In contrast, the invention may be used for plastic material items of any kind in which perfect surfaces without any irregularities are a must. For example, this is the case for compact disc boxes, for floppy disc boxes but also for certain technical plastic material parts, for example wheels, closing caps and the like.

Another problem that is encountered during the injection molding of plastic material items is that the liquid plastic material tends to shrink during cooling down when the plastic material starts to cool down after having been injected into the cavity. This shrinking corresponds to a reduction in volume and, hence, requires to compact the molten plastic material during its cooling down in order to guarantee that the cavity is still entirely repleted with plastic material even if the latter is getting cold, so that the surfaces do not show any depressions and the items are made with reproducible and exact dimensions.

For that purpose the pressure during the injection of molten plastic material is first set to rise until shortly before the maximum of the pressure curve is reached the so-called compacting phase is initiated. After the pressure maximum has occurred, the pressure will be slowly reduced because the liquid plastic material will slowly cool down and eventually vitrify and then solidify. The term "slowly", however, means a relatively fast process because plastic material items of the kind of interest are manufactured as mass products with cycle times in the order of seconds.

German patent application 37 07 362 discloses an injection mold for a plastic material item having a well-defined surface in the sprue area. The item is a specimen rod for automatic measuring machines and must be reproducible in its dimensions, surfaces and angles.

This prior art mold consists of two mold portions. The first mold portion has a first gate channel and two elongated cavities arranged parallel to the gate channel on the right hand side and on the left hand side, respectively, of the latter. The two cavities, however, are not directly connected to the first gate channel. Instead their upper ends open in a radial direction into a guide assembly comprising an axial displaceable element. The displaceable element has an axial channel which exits in a radial direction on its both terminal ends such that two openings of the channel will be flush with the two cavities in a predetermined position of the displaceable element. For interconnecting the first gate channel with the channel within the displaceable element acting as a second gate channel, another cavity is arranged in the other mold portion and is identified as "overflow" which, when the mold portions are closed, overlaps the upper end of the first gate channel as well as the second gate channel within the displaceable element.

During injection of the liquid plastic material, the material flows through the first gate channel, the overflow and then through the second gate channel into the two cavities. As soon as the two cavitities are repleted with plastic material, the injection molding assembly itself generates a compacting pressure and, simultaneously, the displaceable element is axially displaced. This happens when the plastic material has a temperature being about 10%–20% below the vitrifying temperature, i.e. when the plastic material is already partially solidified. The plastic material is, hence, no more liquid at this moment in time. By displacing the displaceable element, the partially solidified plastic material is sheared off in the transition between the second gate channel and the two cavities because the leading edges on the sides of the openings of the second gate channel into the cavities are displaced over these openings.

This injection mold, hence, is a so-called "cold channel mold". The term "cold channel mold" means that after the opening of the mold the sprue will be solidified in the opened mold and needs to be ejected separately. The sprue piece corresponds to the volume of the first gate channel, the overflow as well as the second gate channel.

This prior art mold, hence, has the disadvantage that because of its configuration as a cold channel mold a certain loss in plastic material, namely a loss of the sprue piece occurs during each injection cycle. Further, measures have to be taken to eject and dispose of the sprue piece.

German patent application 28 55 144 discloses a method and an apparatus for producing plastic material items.

This document describes the production of so-called "preforms", i.e. plastic items that are mass-produced in a certain constant size and are later on transformed into containers or bottles of different kinds, in particular by blow-molding processes.

This prior art molding machine uses a low pressure plastifier being connected to an injection cylinder via an output opening. The injection cylinder has a piston assembly on one axial terminal end. The other axial terminal end has a radial duct connected to a cavity assembly being separately displaceable. The configuration is such that the opening from the injection cylinder is located at a position in the cavity assembly where the preform tip is to be made.

The plastic material is molten within the low pressure plastifier and is then transferred under low pressure into the injection cylinder. The output opening of the plastifier is located adjacent the actual end of the injection cylinder being provided with the piston assembly. As soon as the injection cylinder is repleted with plastic material, the piston is displaced forwardly and soon covers the plastifier output opening so that the latter is disconnected. During further displacement of the piston, the liquified plastic material contained in the injection cylinder is disposed from the opposite end of the injection cylinder in a radial direction and then flows into the cavity of the displaceable cavity assembly.

As the injection piston comes to rest on the opposite axial end of the injection cylinder being configured as a radial wall, the injection piston at least partially is displaced over the radial opening directed to the cavity assembly.

The displaceable cavity assembly is then separated from the injection cylinder and is then transferred to another position within the production facility where a compacting and pressure assembly is located. This pressure assembly is provided with a compacting rod. The compacting rod is inserted into the opening of the displaceable cavity assembly for compacting the plastic material within the cavity and being still plastified.

Therefore, the external shape of the preform does not depend on the injection piston. Further, there are no requirements relating to the surface quality on the tip of preforms because preforms, as mentioned above, are always subjected to a further subsequent thermoplastic process.

It is, therefore, an object underlying the invention to improve a method and a mold of the kind mentioned at the outset, such that sprues with optimum surface configuration may be obtained which can no more be identified on the ejected plastic material item with the eye.

Another object is to manufacture plastic material items in a hot channel technology where no sprue pieces at all occur and, hence, losses of plastic material are entirely avoided. Further, no separate steps have to be taken to remove sprue pieces so that the cycle time may be further reduced.

SUMMARY OF THE INVENTION

These and other objects of the invention are achieved by a method for injection-molding plastic material items in a mold comprising at least one cavity and a gate channel for feeding molten plastic material to the cavity, the gate channel being connected to the cavity through an opening, the method comprising the steps of:

injecting molten plastic material into the gate channel and through the opening into the cavity;

displacing a piston along the gate channel and over the opening for interrupting flow of molten plastic material into the cavity and for shearing off the molten plastic material along the opening, thereby closing the cavity.

The objects are, further, achieved by a mold for injection-molding plastic material items in an injection-molding machine, the mold comprising:

at least one cavity having an access opening, a gate channel interconnecting the access opening with a plastic material injection-molding assembly; and a piston arranged in the gate channel and adapted to be displaced along the gate channel for moving a leading edge of the piston along and over the access opening.

Moreover, the objects are achieved by a mold for injection molding plastic material items in an injection molding machine, the mold comprising:

a first mold portion;

a second mold portion, adapted to adjoin said first mold portion along a separation plane when said mold is in a closed operational position;

a cavity arranged in said mold along said separation plane;

an injection molding assembly for liquifying and injecting plastic material;

a gate channel interconnecting said cavity with said injection molding assembly for feeding molten plastic material into said cavity;

means for closing and opening, resp. said gate channel;

means for actuating said closing and opening means;

wherein said injection molding assembly is connected to said first mold portion and said actuating means is arranged in said second mold portion such that said closing and opening means may be actuated when said mold is in said closed operational position and said closing and opening means may remain closed when said mold is in an open operational position.

The object underlying the invention is thus entirely achieved. According to the invention, an excellent surface quality is obtained by shearing off the plastic material extending in its plastified state as a transition from the cavity to the gate channel. Moreover, this may be achieved in a hot channel technology having no sprue pieces at all. In the prior art mold according to German patent application 37 07 362 all of the channels and cavities are exposed after the opening of the mold, i.e. when the two mold portions are separated from each other. The remaining plastic material within the channels and cavities will, therefore, solidify and must be separately disposed of. In contrast, the present invention allows to hold the mold entirely close during a sequence of cycles, even during opening of the mold so that the plastic material will remain in its molten and liquid state in all of the channels even when the mold is opened. Therefore, no separate sprue piece is generated that would need separate injection and disposal.

Moreover, the method according to the invention teaches to shear the plastic material off when it still is in its liquid state in contrast to the prior art where the shearing off of the plastic material takes place when the plastic material has already attained its vitrified, i.e. semi-solidified state.

The term "filling" or repleting in the context of the present application shall also comprise a partial filling of the cavity, as is for example conventional during the so-called foam-injection.

Further, the step of shearing off shall comprise guiding the leading edge of a piston or the like in an axial direction or along a peripheral direction over the access opening of a cavity such that the vector of displacement lies in the plane defined by the access opening.

In a preferred embodiment of the invention the plastic material flows along the gate channel in a first direction and the piston is diplaced along the gate channel in a second direction opposite the first direction.

For that purpose the mold is configured so that means are provided for injecting molten plastic material through the gate channel along a first axial direction and the piston is adapted to be displaced in the gate channel in a second direction opposite the first direction and over the access opening.

These features have the advantage that both functions of the tool, namely the actuation of the piston on the one hand side and the feeding of the liquid plastic material on the other hand side are distributed over two distinct areas of the tool, in particular over the two mold portions. Whereas the actuator is, for example, located in the "cold" mold portion, the "hot" mold portion is devoid of any such actuating elements. This has the advantage that thermal expansion problems which frequently occur in the hot mold portion do not affect any actuators that would be sensible to such expansions. Further, it has the advantage that the mold may be designed with small dimensions because the minimum distance between the cavities is only limited by the size of the plastic material items but not by the actuators for the pistons.

According to a further embodiment of the invention the piston is provided with an axial groove and is arranged to be rotated about its longitudinal axis.

This measure has the advantage that a hot channel system of the above-mentioned kind may be set up wherein an axial displacement of the piston is replaced by a rotation of the piston, which ever may be more advantageous as the case may be.

In any case, i.e. independently of whether the piston shall be axially displaced or rotated about its longitudinal axis, an open position may be set in which the liquified plastic material may freely flow through the opening into the hollow cavity. On the other hand side, a reliable closure of the opening may also be thusly effected.

In a further group of embodiments the liquified plastic material will be compacted and simultaneously sheared off. Preferably the molten plastic material will be compacted after the filling of the cavity but prior to the shearing off.

This happens advantageously by designing the piston as a piston assembly with a central rod and an annular piston slidably arranged on the central rod. The rod and the annular piston may be actuated axially and separately from each other. Further, means are provided for disconnecting the gate channel from the plastic material injection molding assembly.

These features have the advantage that a volume compensation, i.e. a compacting of the molten plastic material during cooling down and solidifying, is possible before the piston entirely covers the access opening. By disconnecting the injection assembly it is possible to already start plastifying the plastic material in the injection assembly for the next injection cycle already during the period of time during which the last injected plastic material item still cools down and solidifies. In such a way the cycle time is further reduced.

According to a further embodiment of the invention the opening will be closed during the shearing off by means of a continuous piston surface.

This feature has the advantage that the opening may be covered with an entirely homogeneous surface. When the opening is configured in the area where the gate channel opens into the cavity, a plastic material item surface devoid of any irregularities may be obtained. In particular those channels in the tool guiding liquid plastic material are entirely shut off so that the function of a hot channel mold, as described above, may be entirely guaranteed.

By properly dimensioning the elements as described before, it is possible according to another embodiment of the invention to easily set the opening size during the injection of the molten plastic material.

When doing so one takes advantage of the fact that the assembly described before is a valve assembly where the flow diameter may be set by displacing the leading edge. By doing so the flow of molten plastic material and, hence, the dynamic pressure of the plastic material in the cavity may be properly set.

The fact that the opening size may be set is of particular advantage for so-called multiple molds having a plurality of cavities of even or uneven shape. In this type of multiple molds a synchronous filling of the many cavities may not be obtained in practice. Instead, some of the cavities will fill sooner than the others. If, however, it is possible according to the afore-mentioned embodiment of the invention to individually set the size of the opening, then the filling process may be individually set for each and every cavity so that the problem discussed above may be entirely avoided. In practice, one will make a "test shot" during which the openings of all cavities are entirely opened. One can then check the filling state after the test shot so as to subsequently and individually reduce the opening size during subsequent test shots in order to obtain a synchronous and homogeneous filling of all of the cavities.

According to an embodiment of a mold according to the invention this may, for example, be obtained by using a piston having an opening that can be brought into at least partial overlap with the cavity access opening during the displacement of the piston.

According to another group of embodiments the molten plastic material is mixed and, hence, homogenized prior to the injection through the access opening.

This is preferably effected by providing the piston with mixing elements on its face being subjected to the flowing molten plastic material. The mixing elements may have the shape of a helix or of radial mixing blades or of a mixing sieve.

These features have the advantage that the flowing molten plastic material is homogenized before it enters through the access opening into the cavity.

According to further embodiments of the invention the gate channel may be shut off after the filling of the cavity.

This may, for example, be effected by letting the piston come to rest on a stop in the gate channel. In particular, the stop may be configured as a latch for locking the piston.

These features have the advantage that after the injection step is over, the piston may remain in that mold portion being provided with the heated channels, i.e. that mold portion being connected to the plastic material injection assembly. For that purpose the piston is inserted into the gate channel on the "hot" mold portion and is locked there by means of a stop or a latch or will remain there by itself. For a subsequent injection cycle the piston may then be thrusted back into the "cold" mold portion under the action of the pressure of the arriving thresh molten plastic material. The access opening is, thus, automatically reopened.

According to a certain group of embodiments, the piston is provided with an essentially axial channel adapted to interconnect the gate channel with the cavity access opening.

In particular, the opening may be configured as an annular slot or groove.

This feature has the advantage that in particular those plastic material items may be manufactured having a circular or non-circular through bore. The piston and the gate channel, respectively, will extend within the mold at a position where the through bore will be located within the plastic material item after its manufacture. Thus, one obtains a plastic material item having an entirely invisible sprue location.

With another group of embodiments, the molten plastic material is simultaneously injected from the gate channel via a pluarality of access openings into a pluarality of cavities. For doing so, the access opening is configured as a plurality of individual access openings.

This feature has the advantage that a plurality of plastic material items may be simultaneously manufactured with a minimum of feed elements.

Moreover, it is preferred to provide a joint actuation unit for a plurality of pistons.

This feature has the advantage that one actuating unit only is required for a plurality of pistons. In a practical embodiment of the invention this may be made, for example, by means of a joint actuating plate as known per se for actuating a plurality of ejector pins in molds.

As mentioned above, the invention may be preferably used for a plurality of fields of applications.

It is, however, particularly preferred to use the invention, without thereby limiting the scope of protection, in the field of manufacturing credit cards, in particular so-called smart cards. Hence, the cavity preferably has the shape of a credit card.

Further advantages will become apparent from the description and the enclosed drawing.

It goes without saying that the features mentioned before and those that will be explained hereafter may not only be used in the particular given combination but also in other combinations or alone without leaving the scope of the present invention.

BRIEF DESCRIPTION OF THE DRAWINGS

Embodiments of the invention are shown in the drawing and will be described in the subsequent description.

DETAILED DESCRIPTION OF THE PREFERRED EMBODIMENTS

Figure 1:
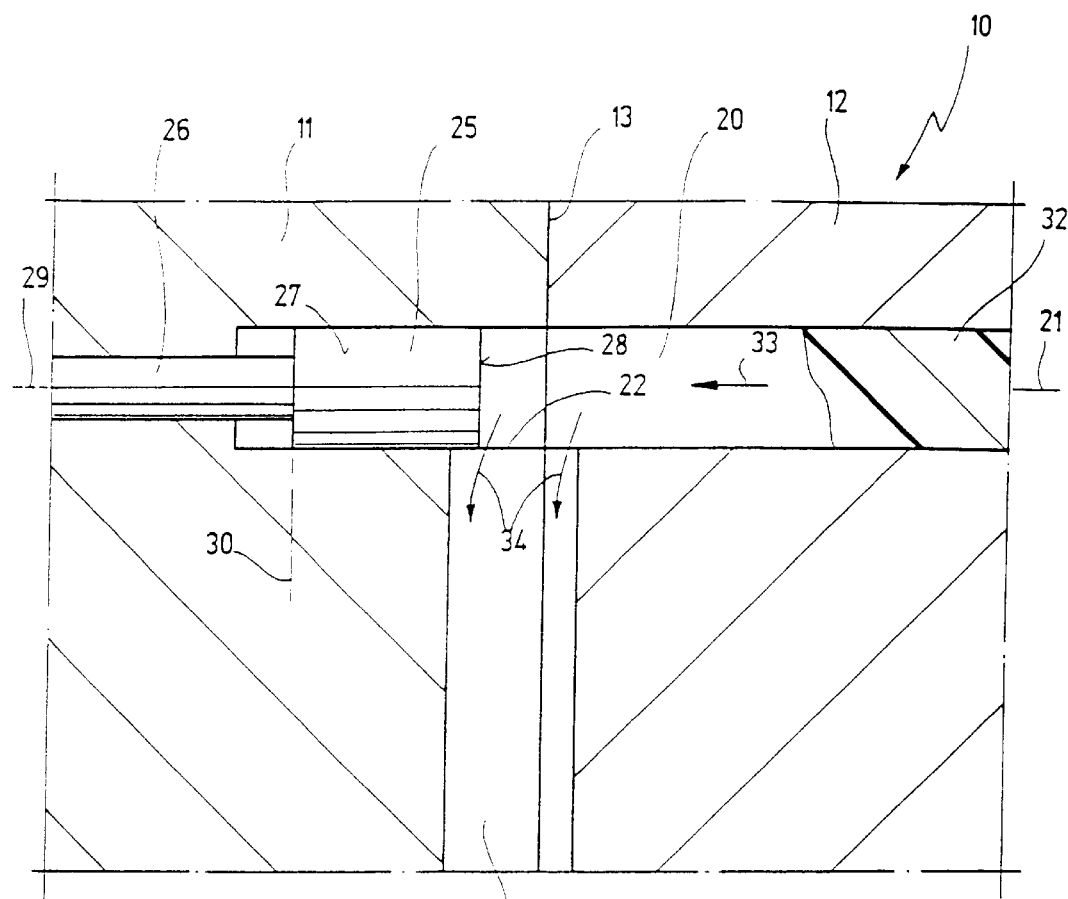
FIG. 1 is a lateral sectional view on enlarged scale of an embodiment of a mold according to the invention.

In FIG. 1, reference numeral 10 generally designates a mold for a plastic material injection molding machine (not shown). Mold 10 comprises a first mold portion 11 and a second mold portion 12. The configuration is such that a plastic material injection assembly (not shown) is connected to second mold portion 12 from the right hand side in FIG. 1. Therefore, second mold portion 12 is generally referred to as the "hot" mold portion, whereas first mold portion 11 on the left hand side in FIG. 1 is generally identified as the "cold" mold portion.

Mold portions 11, 12 adjoin each other along a separation plane 13 when mold 10 is closed. A cavity 14 having a shape being adapted to the shape of the item to be produced is arranged on the embodiment shown in FIG. 1 such that it is formed both by first mold portion 11 as well as by second mold portion 12. Hence, separation plane 13 runs through cavity 14.

It goes without saying that the embodiment shown in FIG. 1 as well as the embodiment shown in the other Figures are to be understood only as an example. It is, of course, possible to configure the mold with more than two mold portions, for example as a stacked mold having a center platen or the like. Moreover, it is of course possible to use a plurality of cavities instead of one cavity 14 only, being shown in FIG. 1 only partially and in a sectional view anyway. Multiple molds having a plurality of cavities are well known in the art.

Mold 10 is provided with a gate or injection channel 20 extending through mold portions 11, 12 in a direction vertical to separation plane 13, as indicated by an axis 21 of gate channel 20. An access opening 22 in cavity 14 acts as a transition from gate channel 20 to cavity 14. Opening 22 may be configured as a slot, as a circular diameter or otherwise. It is, however, preferred to geometrically configure 22 such that it is a slot extending parallel to axis 21.

A valve body, for example a piston 25, runs in gate channel 20. On its left hand side in FIG. 1 piston 25 is provided with a piston rod 26. The circular periphery of piston 25 is designated with reference numeral 27. It may be mentioned at this instance that the cylindrical shape of piston 25 is also to be understood only as an example. Piston 25 may, of course, have a shape other than a circular cylindrical shape, for example a square or elliptic or other diameter shape. In the latter case such non-circular shapes would concurrently act to prevent rotation of piston 25.

A front face 28 shown on the right hand side of piston 25 concurrently acts as a leading edge relative to opening 27, as will be explained in further detail below. Reference numeral 29 designates an actuator, for example a piston-cylinder-unit for axially displacing piston 25 within gate channel 20.

Finally, reference numeral 30 indicates that a rigid or a loose connection may exist in the plane between piston rod 26 and piston 25. It is, for certain applications, possible to disconnect piston 25 from piston rod 26 in certain cases. This will be explained further below in connection with the embodiment of FIG. 8.

Finally, reference numeral 32 in FIG. 1 designates a molten plastic material entering into gate channel 20 from the right hand side and from an injection molding assembly (not shown). Molten plastic material 32 flows leftwardly, as indicated by arrow 33. Molten plastic material 32 is then deflected at front face 28 of of piston 25 in a downward direction and then flows through preferably slot-shaped opening 22 into cavity 14.

The first operational position of piston 25 shown in FIG. 1 will be maintained as long as molten plastic material 32 flows into cavity 14.

Figure 2:
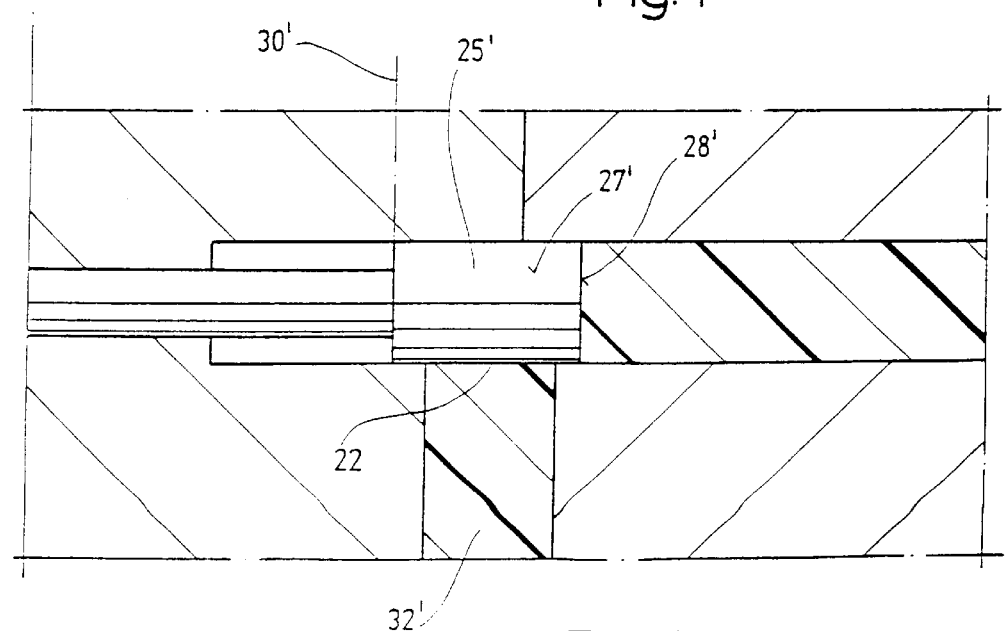
FIG. 2 shows the mold of FIG. 1, however, in another operational position.

As soon as cavity 14 is repleted and molten plastic material 32 is, preferably, compacted in order to compensate for the shrinking of molten plastic material 32 during cooling down, piston 25 is displaced into a second operational position shown in FIG. 2. In FIG. 2 all elements are designated with the same reference numerals, different positions, however, are indicated by adding an apostrophy to the reference numerals.

For certain plastic material injection methods the cavity is not entirely repleted with molten plastic material but only with a quantity of plastic material being smaller than the cavity volume. For example this is made in a method generally referred to as "foam injection" where an increase of volume caused by the generation of foam in the molden plastic material has to be taken into account. In other methods, for example in connection with so-called "breathing molds" the cavity is increased in size after the injection of the molten plastic material so that in these cases, too, a smaller amount of molten plastic material is injected into the cavity.

As can clearly be seen from FIG. 2, piston 25' now entirely covers opening 22 by means of its cylindrical peripheral surface 27'. During the displacement of piston 25 between the operational positions shown in FIGS. 1 and 2, front face 28 acting as a leading edge of piston 25 which, in turn, has the function of a valve member, was displaced over access opening 22 and has sheared off the plastic material 32 or 32' extending through opening 22. Therefore, continuous, i.e. homogeneous peripheral surface 27' of piston 25 is now situated above opening 22, thus imparting a homogeneous and, hence, optically excellent surface to plastic material 32' being now in the process of solidifying within cavity 14.

Figure 3:
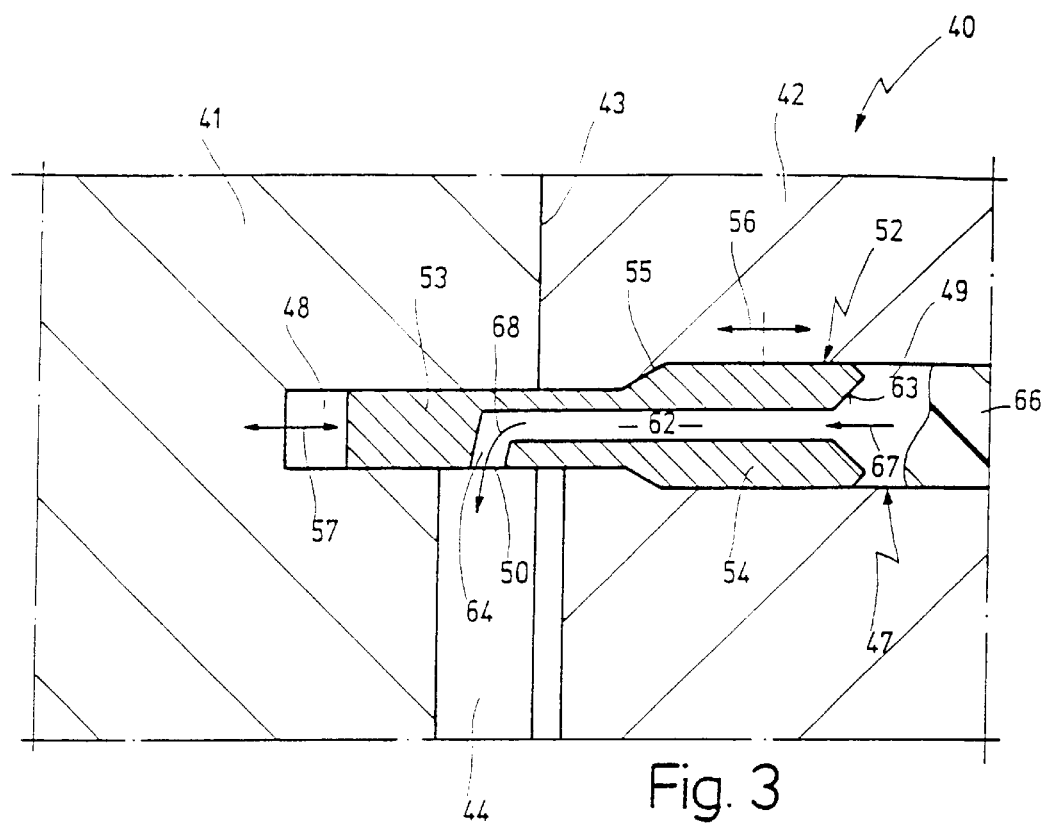
FIG. 3 is an illustration, similar to that of FIG. 1, however, for a second embodiment of the invention.

In the modified embodiment of FIG. 3, a mold 40 is provided with mold portions 41, 42 adjoining each other along a separation plane 43 and enclosing between them a cavity 44.

In the case of FIG. 3, a gate channel 47 has a left restricted section 48 as well as a right enlarged section 49. Restricted section 48 is connected to cavity 44 via an access opening 50.

A valve member or piston 52 is also configured with a stepped shape. It has a left, thin section 53 as well as a right thick section 55 being dimensioned to match sections 48, 49 of gate channel 47. Piston 52 axially abuts a frusto-conical transition 55 in gate channel 47 which, at this instance, acts as an axial stop.

For axially displacing piston 52, a first actuator 56 and a second actuator 57 are provided alternately. First actuator 56 engages piston 52 at its thick section 54, whereas second actuator 57 engages piston 52 at its left front face of thin section 53.

Figure 4:
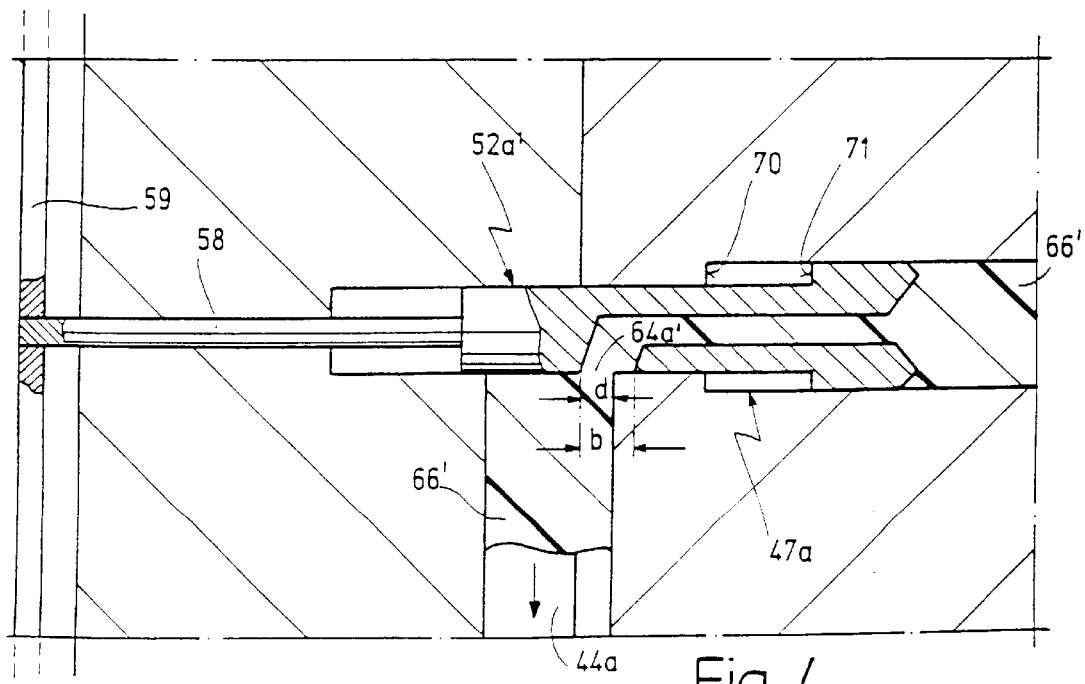
FIG. 4 is an illustration, similar to that of FIG. 3, however, for a third, slightly modified embodiment of the invention.

As can be taken from the embodiment of FIG. 4, left actuator 57 is preferably also designed as a piston rod 58 (cf. FIGS. 1 and 2). As particular feature of the embodiment of FIG. 4, piston rod 58 is connected to an actuator plate 59. Actuator plate 59 is configured similarly as prior art actuator plates for ejector pins in such molds. Thus, it is possible to simultaneously actuate a plurality of such piston rods 58.

Turning now back to the embodiment of FIG. 3, one can easily see that piston 52 has an axial transition channel 62. Channel 62 has a first opening 63 communicating on the right hand side of FIG. 3 with gate channel 47. A second port or opening 64 on the left hand side end of channel 62 is bended downwardly and communicates with access opening 50 of cavity 44.

If a molten plastic material 66 flows into gate channel 47 from the right hand side, as indicated by arrow 67, molten plastic material 66 flows into first port 63, then through channel 62 and finally through second port 64 and through access opening 50 into cavity 44.

After the termination of the injection process, i.e. when cavity 44 is repleted, piston 52 is displaced rightwardly.

This condition is depicted in FIG. 4 for a slightly modified embodiment. In this modified embodiment of FIG. 4, like elements are designated with like reference numerals, modifications, however, are designated by adding an "a" and various operational positions are again identified by the addition of an apostrophe.

As one can see from FIG. 4, the frusto-conical transition 55 of FIG. 3 was replaced by radial stops 70 and 71.

Further, second port 64a' is configured somewhat broader in an axial direction, namely with a width b. If piston 52a' is now displaced rightwardly, the right hand side wall of cavity 44a in FIG. 5 acts as a leading edge relative to second port 64a'. By appropriately positioning piston 52a' in an axial direction, the diameter or size of the opening in the area of second port 64a' may be set, as indicated by d in FIG. 4. It is, thus, possible to precisely adjust the injection process.

As already explained above, this adjustment option is particularly useful for multiple tools where the openings for a plurality of cavities may be individually set, such that all such cavities may be filled synchronously.

As soon as cavity 44a is repleted with molten plastic material 66', piston 52a' is displaced in gate channel 47a further to with the right hand side, as shown in FIG. 4, so that the same conditions are established as has been described in connection with the embodiment of FIG. 2.

Figure 5:
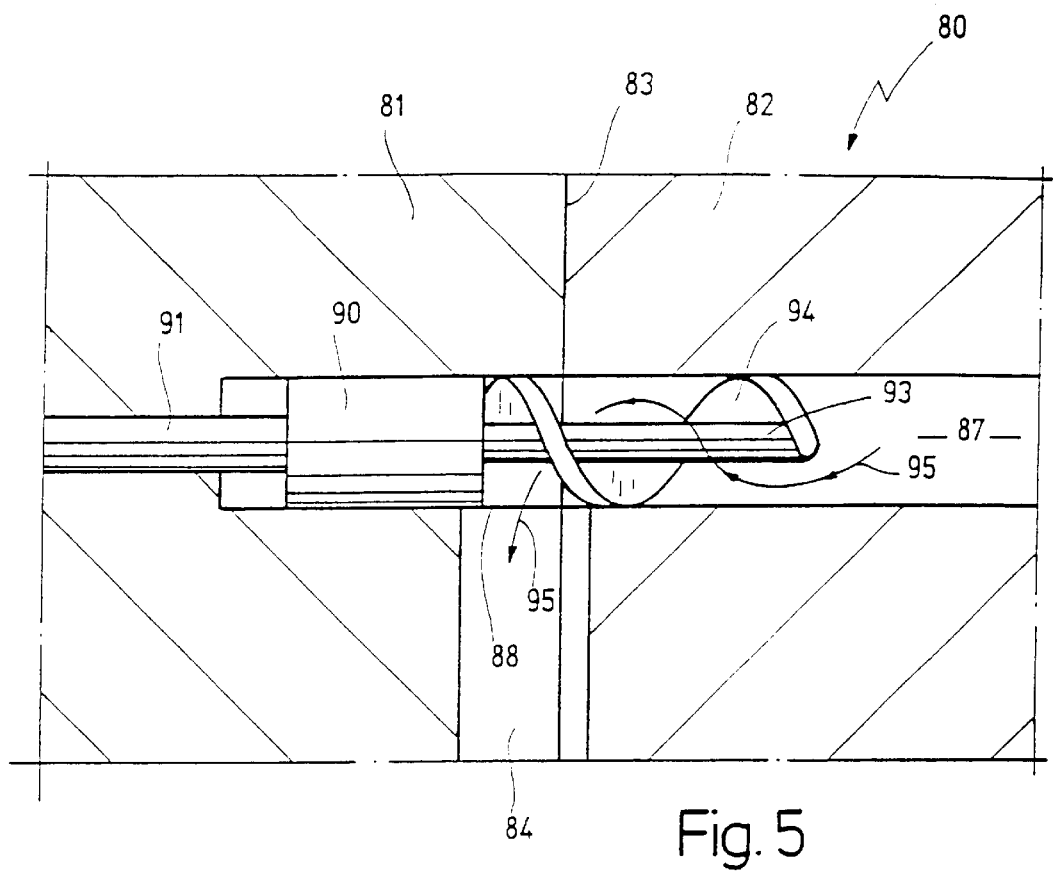
FIG. 5 is an illustration, similar to that of FIG. 1, however, for a fourth embodiment of the invention.

FIG. 5 shows a fourth embodiment of the invention with a mold 40 having mold portions 81, 82, adjoining each other along a separation plane 83 when the mold is closed and enclosing between them a cavity 84.

A gate channel 87 is configured similar to the embodiments of FIGS. 1 and 2. A port 88 interconnects gate channel 87 with cavity 84. A valve member or piston 90 runs in gate channel 87 and may be actuated by means of a piston rod.

The particular feature of the embodiment of FIG. 5 consists in that piston 90 is provided with an axially projecting rod 93 of smaller diameter on its right hand front face in FIG. 5. Rod 93 is provided with a helix 94. Due to the presence of helix 94 the molten plastic material entering into gate channel 87 from the right hand side must propagate around helix 94 as indicated by helical arrow 95. Due to this propagation of the molten plastic material a mixing and, hence, homogenization of molten plastic material is caused. A similar effect may be caused by using a mixing seve (not shown).

Figure 6:
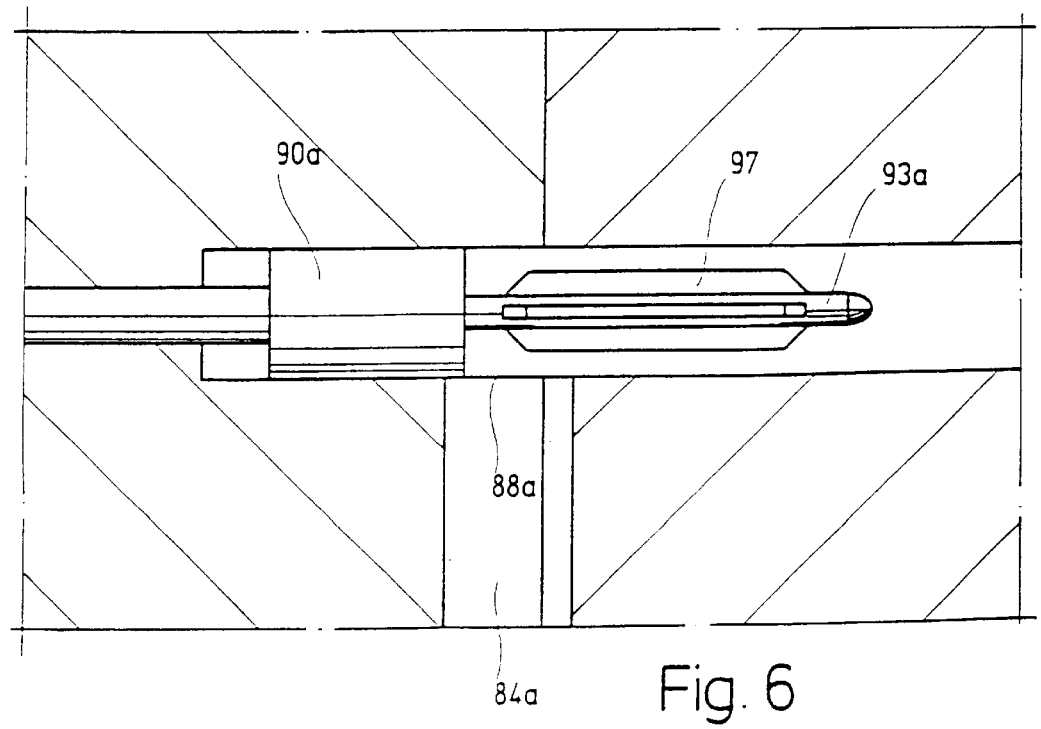
FIG. 6 is an illustration, similar to that of FIG. 5, however, for a fifth embodiment of the invention, slightly modified as compared with that of FIG. 5.

In the modified embodiment of FIG. 6 where like elements are designated by adding an "A", the helix is replaced by a plurality of radial mixing blades 97 projecting laterally and radially from rod 93a. In this case a mixing of the arriving molten plastic material is effected because an opening 88a is located below rod 93a having the mixing blades 97. Those portions of the molten plastic material flowing above rod 93a from the right hand side to the left hand side in FIG. 6 must, hence, pass mixing blades 97 laterally in order to flow to opening 88a. Therefore, a mixing effect is also caused.

Figure 7:
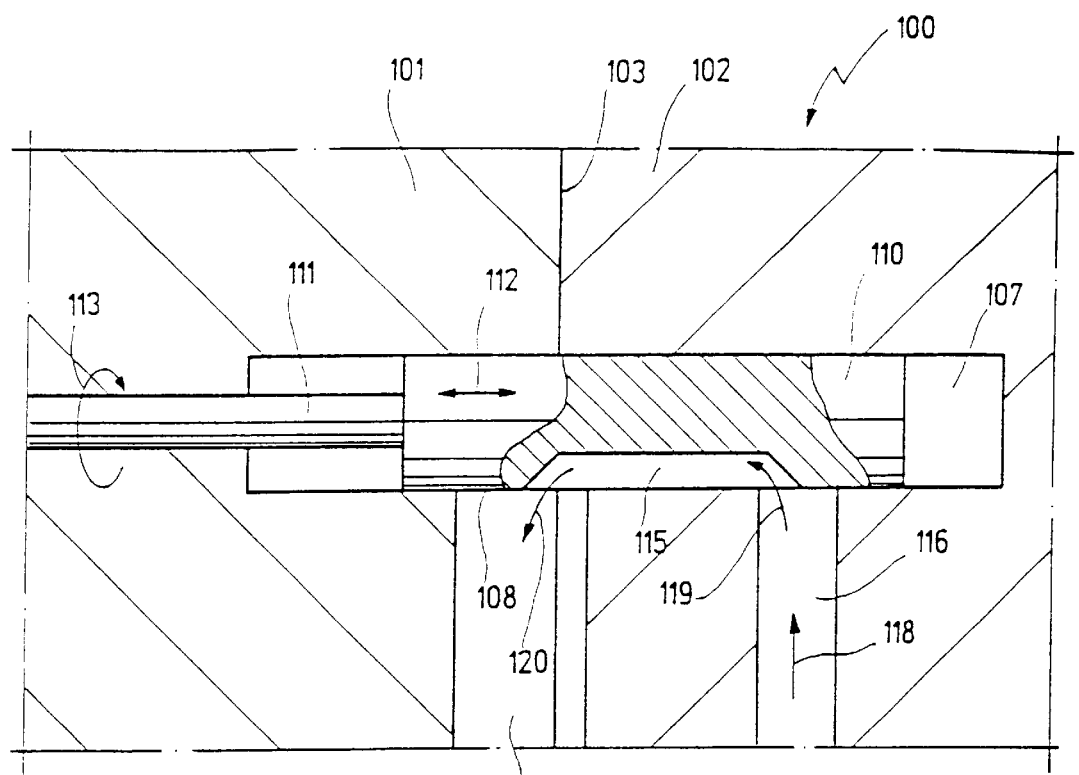
FIG. 7 is an illustration, similar to that of FIG. 1, however, for a sixth embodiment of the invention.

FIG. 7 shows a sixth embodiment of the invention with a mold 100 and two mold portions 101, 102 adjoining each other along a separation plane 103 and enclosing between them a cavity 104.

In this case, too, a gate channel 107 is provided communicating with an access opening 108 of cavity 104.

The particular feature of the embodiment shown in FIG. 7 consists in that the gate channel 107 is closed off to the right hand side in second mold portion 102.

A valve member or piston 110 runs in gate channel 107 and may be actuated from its left hand side by means of a piston rod 111.

As indicated by an arrow 112, piston 110 may be displaced along gate channel 107 in an axial direction, as was described several times above. As an alternative, it is also possible to rotate piston 110 about the axis of gate channel 107. This is indicated in FIG. 7 by an arrow 113.

Piston 110 at its lower side is provided with an axial groove 115 extending in an axial direction over a portion of the cylindrical peripheral surface. Axial groove 115 along its axial length is configured such that it connects the access opening 108 of cavity 104 with a feed channel 116 in the operational position shown in FIG. 7. Feed channel 116 is directed radially to gate channel 107 and opens into the latter in the neighborhood of its right end shown in FIG. 7.

A molten plastic material entering into feed channel 116 from below flows through the latter in the direction of an arrow 118. As indicated by an arrow 119, the molten plastic material then enters into axial groove 115 of piston 110 and is concurrently deflected by 90°. As indicated by an arrow 120, the molten plastic material will then enter from the left end of axial groove 115 through access opening 108 and into cavity 104. Concurrently, it is again deflected by 90°.

If piston 110 is now displaced in an axial direction (arrow 112) and/or rotated (arrow 113), the position of axial groove 115 relative to access opening 108 and to feed channel 116 may be varied such that the flow of molten plastic material may be properly set by means of the resulting leading edges. As soon as cavity 104 is repleted with plastic material and the latter was eventually compacted, opening 108 may be closed by either displacing piston 110 further to the right hand side or by rotating same such that axial groove 115 no more overlaps opening 108. The molten plastic material is concurrently sheared off over opening 108 either in an axial or in a peripheral direction.

Figure 8:
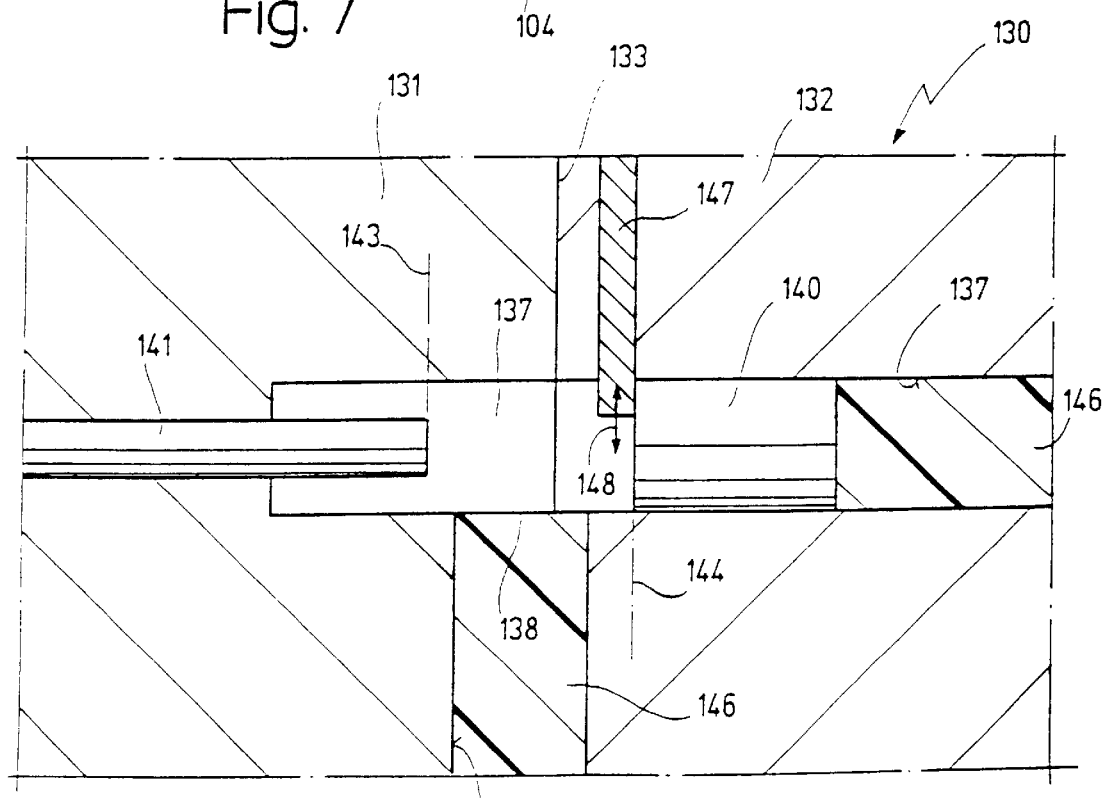
FIG. 8 is an illustration, similar to that of FIG. 1, however, for a seventh embodiment of the invention.

The seventh embodiment of the invention shown in FIG. 8 has a mold 130 with two mold portions 131, 132 adjoining each other along a separation plane 133 and enclosing between them a cavity 134.

A gate channel 137 is configured similar to the above-described embodiment of FIGS. 1 and 2. It communicates with a cavity 134 via an access opening 138.

A valve member or piston 140 is provided with a piston rod 141. However, piston rod 141, as already indicated in connection with FIGS. 1 and 2, only loosely engages piston 140, as indicated by planes 143 and 144.

Considering now again briefly the embodiment of FIGS. 1 and 2 for a better understanding of the mold 130 according to FIG. 8, it may be assumed that mold 10 according to FIGS. 1 and 2 is in the operational position shown in FIG. 2. Cavity 104 is, therefore, repleted with molten plastic material 146.

For discharging the plastic material item, thusly manufactured, tool 130 must be now opened along separation plane 133.

In order to avoid that during the open time of mold 130 liquid plastic material 146 is dispensed from gate channel 137 from the right hand side and, hence, pollutes the mold or the injection molding machine, it is appropriate to displace piston 140 prior to the opening of mold 130 as far to the right hand side, as shown in FIG. 8. Piston 140 then acts as a closure closing off gate channel 137 to the left hand side.

Considering that piston rod 141 together with its actuator (not shown) is arranged in the first mold portion 131, being the "cold" mold portion and, on the other hand side, piston 140 shall remain within the "hot", second mold portion 132, piston 140 must be separated from piston rod 141. This may easily be effected by simply moving first mold portion 131 away from second mold portion 132. As piston rod 141 only loosely adjoins piston 140, as mentioned above, these two elements will be separated from each other, as can clearly be seen from FIG. 8. Of course, piston rod 141 may also be displaced to the left hand side by means of the actuator, in order to effect the desired separation.

Piston 140 is now loosely arranged in gate channel 137. Therefore, if a pressure were exerted on piston 140 from the right hand side, for example from molten plastic material 146, then piston 140 would be ejected from gate channel 137 in leftward direction.

A latch pin 147 is provided for preventing an ejection of piston 140 in such situations. Latch pin 147 may be displaced from above in a radial direction to the axis of gate channel 147, as indicated by an arrow 148 in FIG. 8.

As soon as the closing postion of piston 140 is reached, as shown in FIG. 8, a latch pin 147 will be displaced downwardly until it partially overlaps the left front face of piston 140. Piston 140 is thus locked and, hence, is a safe closure for gate channel 137.

Figure 9:
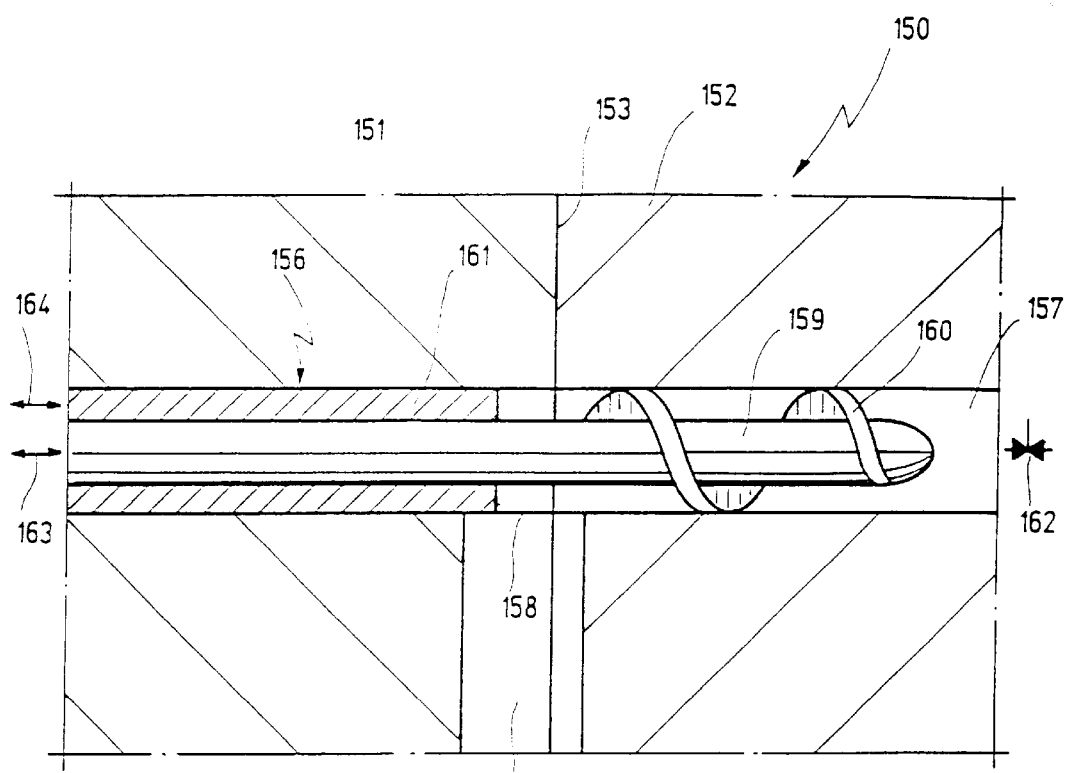
FIG. 9 is an illustration, similar to that of FIG. 1, however, for an eighth embodiment of the invention.

FIG. 9 shows an eighth embodiment of the invention with a mold 150 having mold portions 151, 152 adjoining each other along a separation plane 153 and enclosing between them a cavity 154.

A valve member or piston assembly, designated by 156, runs in a gate channel 157. Gate channel 157 communicates with a cavity 154 via an access opening 158.

Piston assembly 156 comprises a thin rod 159 having a helix 160 on its right free end, similar to the embodiment of FIG. 5.

A compacting annular piston 161 runs on rod 159. As shown by arrows 163 and 164, rod 159 together with helix 160 on the one hand side and compacting annular rod 161 on the other hand side may be separately and individually displaced in an axial direction. Gate channel 157 communicates with an injection molding assembly (not shown) via a valve 162 or any other closure element that might be appropriate.

For operating mold 150, compacting annular piston 161 first remains in its left hand side position shown in FIG. 9 until the molten plastic material has repleted cavity 154. Valve 162 or any other appropriate closure element is now closed. Compacting annular piston 161 is then displaced to the right hand side, to the extent as is necessary for compacting the molten plastic material in order to compensate for the shrinking occurring during the initial cooling down of the plastic material. Rod 159 together with helix 160 remain in their position shown in FIG. 9 during the displacement of compacting annular piston 161.

Figure 10:
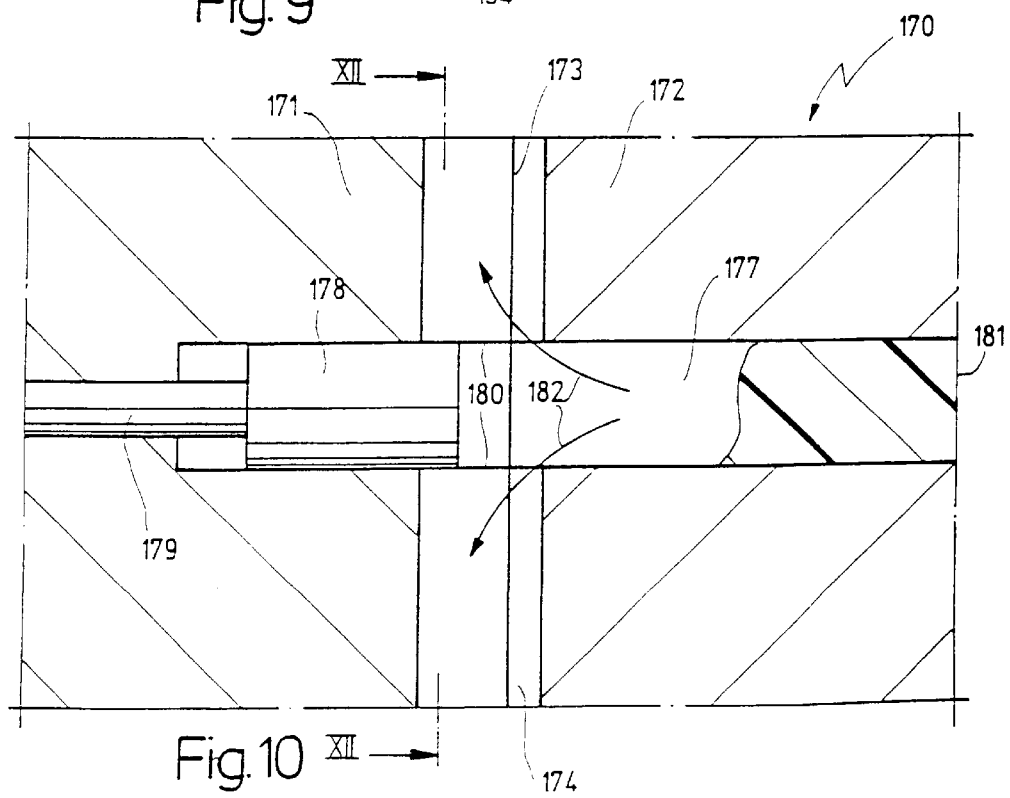
FIG. 10 is an illustration, similar to that of FIG. 1, however, for a ninth embodiment of the invention.

FIG. 10 shows a ninth embodiment of the invention. A mold 170 comprises mold portions 171, 172, adjoining each other along a separation plane 173 and enclosing between them a cavity 174.

A gate channel 170 essentially corresponds to the configuration of the above-described embodiments of FIGS. 1 and 2. A valve member or piston 178 runs in gate channel 177 and may be displaced linearly by means of a piston rod 179.

The particular feature of this embodiment consists in that cavity 174 communicates with gate channel 177 not only from one side but from several sides or even over the entire periphery of gate channel 177. Therefore, there is either one continuous opening 180 extending over the periphery of gate channel 177 or there are several, for example two or four such openings 180 communicating with a plurality of separate cavities.

When a molten plastic material 181 flows through gate channel 177, the plastic material is distributed in various directions radially to the axis of gate channel 177, as indicated by arrows 182.

Figure 11:
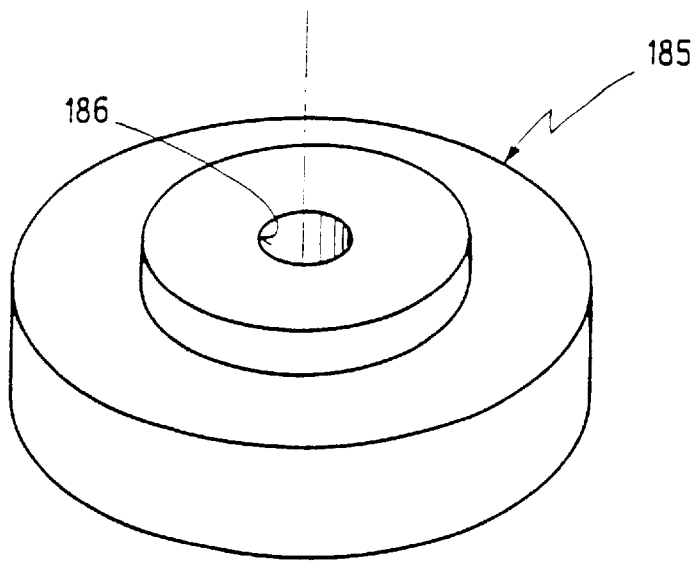
FIG. 11 is a perspective view of an item, as may be manufactured with the mold of FIG. 10.
Figure 12:
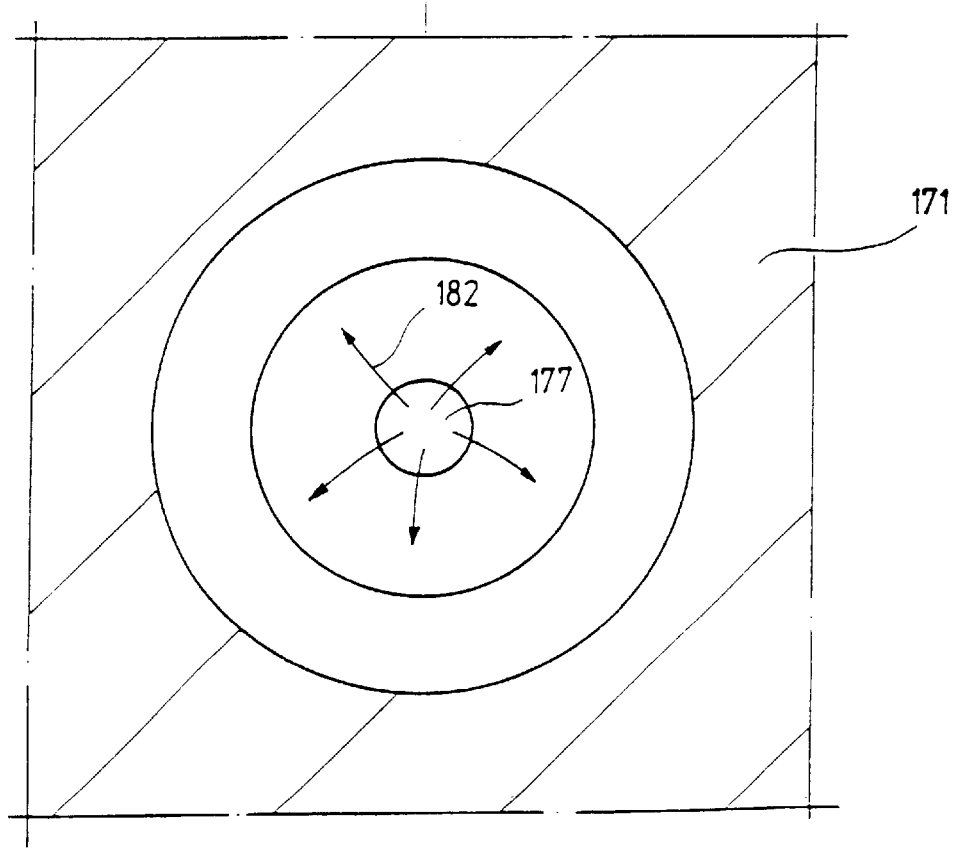
FIG. 12 is a sectional view along the line XII—XII of FIG. 10.

The embodiment of FIG. 10 may, for example, be used for the production of a wheel, a roll or like items, as depicted in a perspective view in FIG. 11 and designated by 185. Wheel 185 is of rotational symmetry. It has a through bore 186 being arranged centrally in the depicted embodiment. For producing the wheel 185, cavity 174 is arranged in mold 170 such that bore 186 is flush or coaxial with gate channel 177. If piston 178 is in its left end position during the injection process, as shown in FIG. 10, molten plastic material 181 may freely flow from gate channel 177 in a radial direction, as becomes particularly clear from the side elevational view according to FIG. 12. As soon as cavity 174 is repleted, piston 178 will be displaced to the right hand side so that on the one hand side gate channel 177 is separated from cavity 174 by simultaneously shearing off the remaining plastic material. On the other hand side, piston 178 being in its projected position generates the above-mentioned through bore 186 within solidifying wheel 185 because piston 178 is exactly at that position. For unmolding wheel 185 from mold 170, piston 178 is first retracted so that wheel 185 may then easily be ejected by means of conventional ejector pins.

Figure 13:
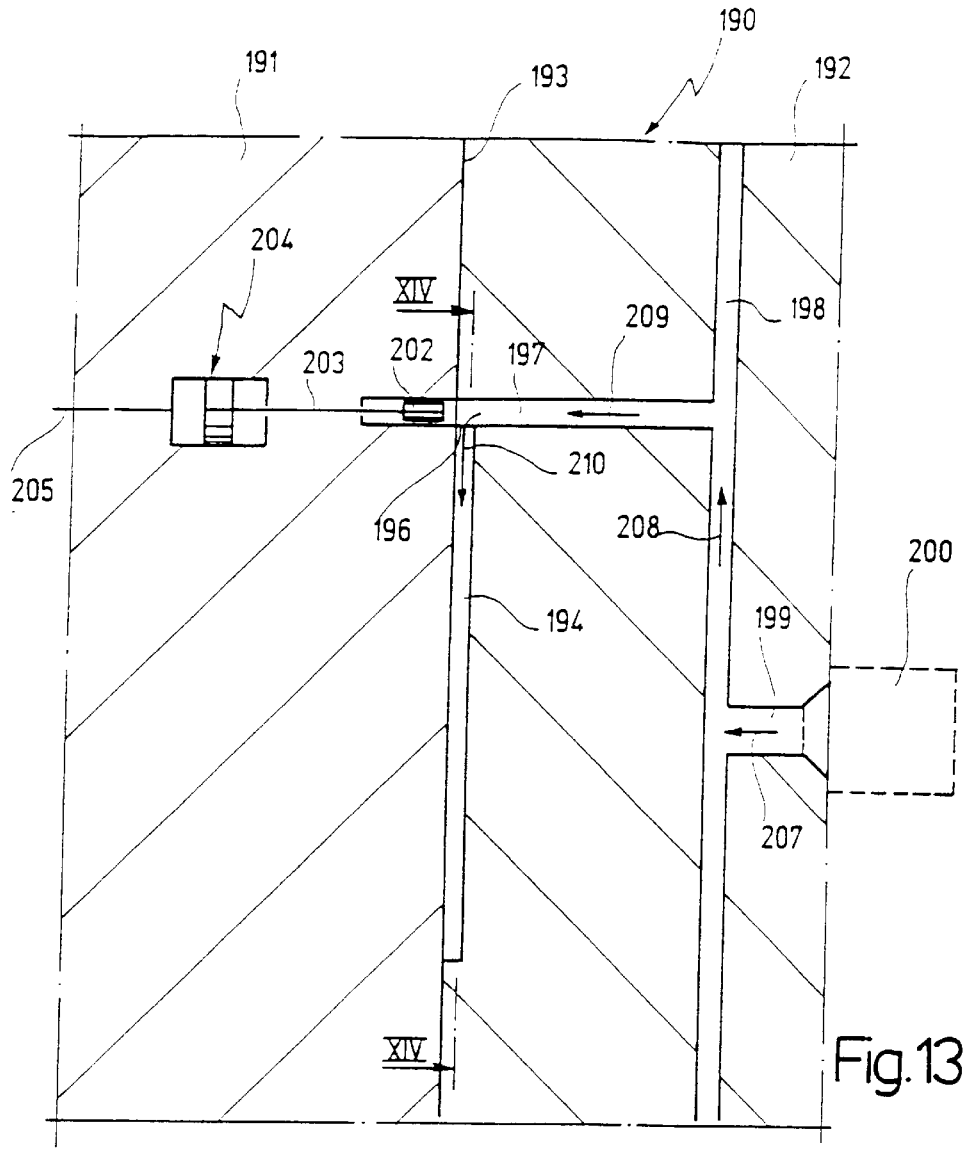
FIG. 13 is a lateral view, on reduced scale, cut away, for illustrating a tenth embodiment of the invention.

FIG. 13 shows a tenth embodiment of the invention, however, on reduced scale. Mold 190 comprises mold portions 191, 192 adjoining each other along a separation plane 193 and enclosing between them a cavity 194. In this embodiment cavity 194 is only provided within second mold portion 192.

An access opening 196 acts as a transition to a gate channel 197 of a kind as described above. Gate channel 197, in turn, communicates with a feed channel 198. Feed channel 198, preferably, is a heated distributor channel. Heated channel systems of this kind are also referred to as so-called manifolds.

Feed channel 198 is provided with a connector opening 199 for an injection molding assembly, indicated schematically by reference numerals 200.

A valve member or piston 202 runs in gate channel 197 and may be actuated by means of a piston rod 203. Piston rod 203, in turn, is connected to a piston-cylinder-unit 204 which, in turn, may be controlled via a control line 205.

As can clearly be seen from FIG. 13, piston 202 together with its actuator elements, namely piston rod 203 as well as piston-cylinder-unit 204, are all arranged in the first mold portion 191, the so-called "cold" mold portion. Second mold portion 192, the so-called "hot" mold portion, is, in contrast, connected to injection molding assembly 200. The aforementioned units are, hence, housed within different mold portions and are, therefore, decoupled both with respect to their location within the machine and, further, thermally.

If injection-molding assembly 200 is actuated, a predetermined amount of molten plastic material flows in the direction of an arrow 207 into feed channel 198 and, further (arrow 208) into gate channel 197 (arrow 209). Molten plastic material is now deflected by 90° (arrow 210) and then flows into cavity 194. The remaining function of this embodiment of FIG. 13 is comparable to the embodiments of FIGS. 1 and 2.

Figure 14:
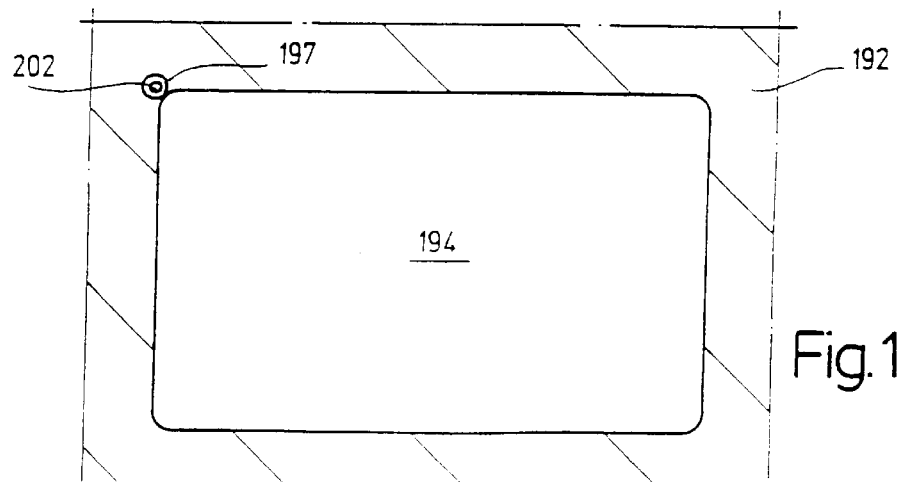
FIG. 14 is a sectional view along the line XIV—XIV of FIG. 13, however rotated by 90° within the plane of the drawing.

Cavity 194 of the embodiment shown in FIG. 13 and 14 has the shape of a credit card, in particular of a so-called smart card. For that purpose gate channel 197 is arranged in a position in which it adjoins to a rounded corner of cavity 194. If gate channel 197 has a circular cylindrical shape, then only a minor geometrical penetration between the circular cylinder (gate channel 197) with the circular cylinder of the rounded corner of cavity 194 occurs. It goes, however, without saying that gate channel 197 as well as the gate channels of the other described embodiments may also have another diameter, for example a square or an elliptic diameter.

Figure 15:
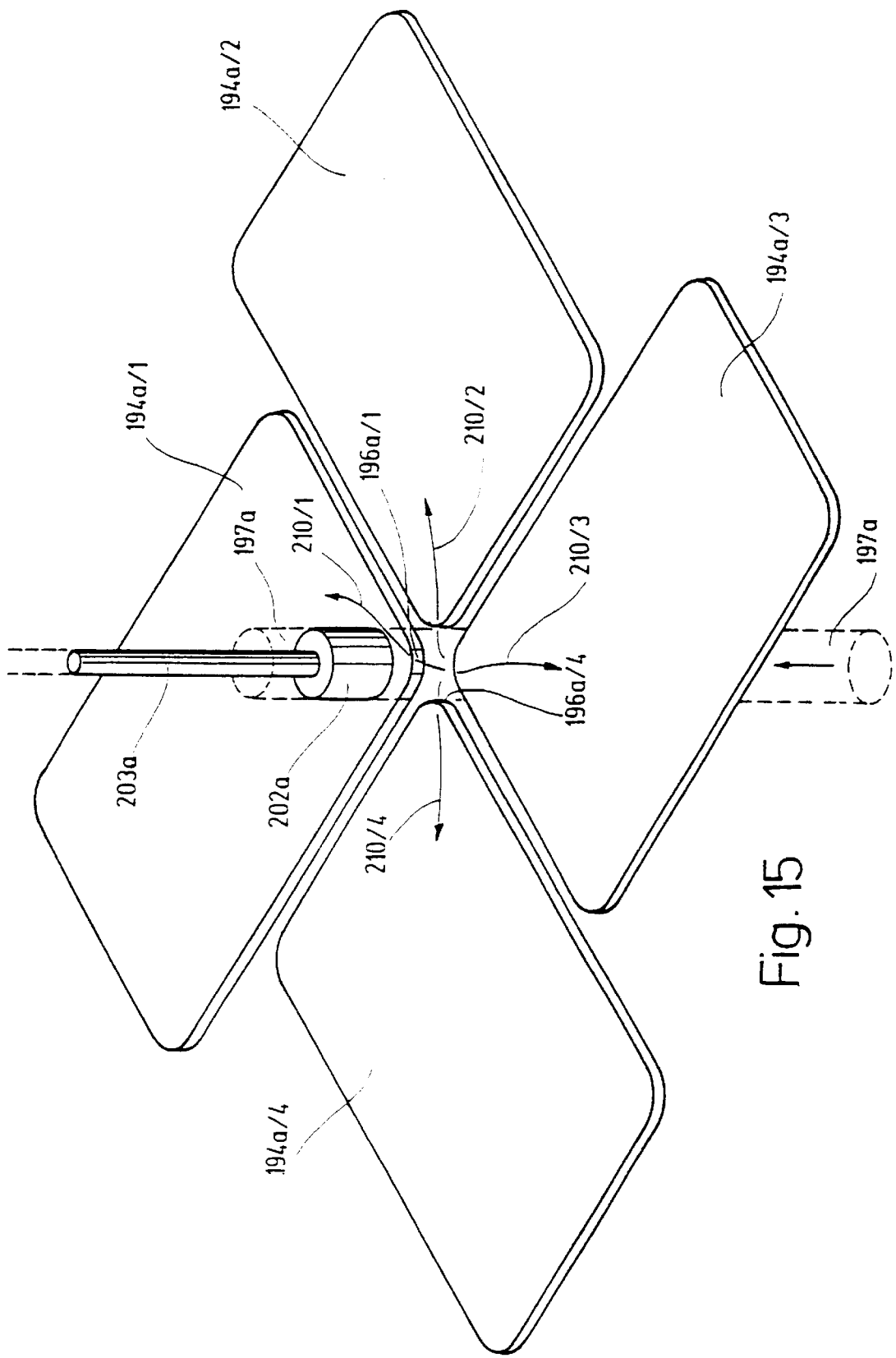
FIG. 15 is a perspective view for illustrating a modification of the tenth embodiment of FIG. 13.

FIG. 15, finally, shows another modified embodiment relative to that of FIGS. 13 and 14. As already indicated with respect to the embodiment of FIGS. 10 through 12, a gate channel may be connected to a plurality of cavities. In FIG. 15 like elements are, therefore, designated with like reference numerals, however, an "a" has been added as compared to the illustrations of FIGS. 13 and 14.

As one can see, the embodiment of FIG. 15 has a whole of four cavities 194*a*/1 through 194*a*/4 being arranged in a radial plane around the axis of a gate channel 197*a* in a shamrock-shaped arrangement. Gate channel 197*a* communicates via four openings 196*a*/1 through 196*a*/4 with the cavities 194*a*/1 through 194*a*/4. Piston 202*a* being displaceable in an axial direction by means of a piston rod 203*a* may, hence, open or close all of the openings 196*a*/1 through 196*a*/4, as already indicated. As a result, four credit cards may be produced via one gate channel only or, in other fields of application, even a larger number of certain plastic items may be produced.

I claim:

1. A mold for injection molding plastic material items in an injection molding machine, the mold comprising:

a first mold portion;

a second mold portion, adapted to adjoin said first mold portion along a separation plane when said mold is in a closed operational position;

a cavity arranged in said mold along said separation plane;

an injection molding assembly for liquifying and injecting plastic material;

a gate channel interconnecting said cavity with said injection molding assembly for feeding molten plastic material into said cavity;

means for closing and opening, respectively, said gate channel;

means for actuating said closing and opening means when the plastic material in the gate is molten; wherein said injection molding assembly is connected to said first mold portion and said actuating means is arranged in said second mold portion such that said closing and opening means may be actuated when said mold is in said closed operational position and said closing and opening means may remain closed when said mold is in an open operational position.

2. The mold of claim 1 wherein said gate channel extends within said first and said second mold portion and runs through said separation plane, said closing and opening means being configured as a valve member arranged in said gate channel.

3. The mold of claim 1 wherein said valve member is configured as a piston running in said gate channel, said piston being located in said second mold portion when said mold is in said closed operational position and is located in said first mold portion when said mold is in said open operational position, said actuating means being configured as a piston rod engaging said piston in said closed operational position and being separated from said piston in said open operational position.

4. An injection molding machine comprising:

a hot channel mold having a hot first mold portion;

a cold second mold portion;

means for displacing said first and said second mold portions relative to one another between an open operational position in which said mold portions are distant from each other and a closed operational position in which said mold portions adjoin each other along a separation plane;

a cavity arranged in said mold along said separation plane;

a gate channel connected to said cavity via an access opening, said gate channel extending through said first and said second mold portion along a first direction;

a piston arranged in said gate channel and adapted to be displaced therealong for moving a leading edge of said piston along and over said access opening for interrupting flow of molten plastic material into said cavity and for shearing off said molten plastic material;

means for displacing said piston along said gate channel when said mold is in said closed operational position, said displacing means comprising an actuator arranged in said second mold portion, said displacing means being adapted to displace said piston from a first gate channel position within said second mold portion over said separation plane to a second gate channel position within said first mold portion adjoining said separation plane, thus preventing liquid plastic material from being dispensed from said gate channel when said mold is opened;

a manifold comprising a heated feed channel extending within said first mold portion along a second direction and interconnecting said gate channel with a connector opening; and a plastic material injection assembly for liquefying and injecting plastic material, said assembly being adapted to be connected to said connector opening for injecting molten plastic material into said heated feed channel.

\* \* \* \* \*